(12) United States Patent
Matsuo et al.

(10) Patent No.: US 7,875,557 B2
(45) Date of Patent: Jan. 25, 2011

(54) SEMICONDUCTOR SUBSTRATE TREATING METHOD, SEMICONDUCTOR COMPONENT AND ELECTRONIC APPLIANCE

(75) Inventors: Hiroyuki Matsuo, Nagano-ken (JP); Kunihiro Miyazaki, Oita-ken (JP); Toshiki Nakajima, Nagano-ken (JP)

(73) Assignees: Seiko Epson Corporation (JP); Kabushiki Kaisha Toshiba (JP)

( * ) Notice: Subject to any disclaimer, the term of this patent is extended or adjusted under 35 U.S.C. 154(b) by 1107 days.

(21) Appl. No.: 11/313,255

(22) Filed: Dec. 20, 2005

(65) Prior Publication Data
US 2006/0144421 A1   Jul. 6, 2006

(30) Foreign Application Priority Data
Dec. 21, 2004  (JP) .............................. 2004-370228
Sep. 21, 2005  (JP) .............................. 2005-274764

(51) Int. Cl.
*H01L 21/302* (2006.01)
*H01L 21/461* (2006.01)

(52) U.S. Cl. ................... 438/745; 438/753; 438/756

(58) Field of Classification Search ............... None
See application file for complete search history.

(56) References Cited

U.S. PATENT DOCUMENTS

| | | | |
|---|---|---|---|
| 5,509,970 A | * | 4/1996 | Shiramizu ................... 134/3 |
| 5,716,535 A | * | 2/1998 | Lee et al. .................... 216/99 |
| 6,290,859 B1 | * | 9/2001 | Fleming et al. ............... 216/2 |
| 6,399,504 B1 | * | 6/2002 | Lee et al. ..................... 438/705 |
| 6,645,876 B2 | | 11/2003 | Saito et al. |
| 6,927,176 B2 | * | 8/2005 | Verhaverbeke et al. ....... 438/745 |
| 2005/0092348 A1 | * | 5/2005 | Chiang et al. ................. 134/1 |
| 2006/0054181 A1 | * | 3/2006 | Rayandayan et al. .......... 134/1 |

FOREIGN PATENT DOCUMENTS

| JP | 03-208899 | 9/1991 |
|---|---|---|
| JP | 8-18920 | 2/1996 |

OTHER PUBLICATIONS

Ritsuo Takizawa, et al., "Clean Silicon Wafer Surface by a Slight Etch Method", Extended Abstracts of the 20$^{th}$ (1988 International) Conference on Solid State Devices and Materials, pp. 475-478 (1988).

* cited by examiner

*Primary Examiner*—Duy-Vu N Deo
(74) *Attorney, Agent, or Firm*—Harness, Dickey & Pierce, P.L.C.

(57) ABSTRACT

A semiconductor substrate treating method is disclosed that can selectively remove contaminants or unnecessary substances present on the surface of a semiconductor substrate. Also disclosed are a semiconductor component of enhanced reliability produced by this method and an electronic appliance incorporating the semiconductor component. The semiconductor substrate treating method comprises the step of treating a semiconductor substrate with a treating fluid containing $NH_4OH$ and HF wherein the relationships $0.30 \leq X/Y \leq 0.78$ and $0.03 \leq Y \leq 6.0$ are satisfied, where X represents a concentration [mol/L] of $NH_4OH$ in the treating fluid and Y represents a concentration [mol/L] of HF in the treating fluid. Preferably, the treating fluid is substantially free from $H_2O_2$. The semiconductor substrate has a surface, at least a part of which is composed of high melting point metal.

10 Claims, 6 Drawing Sheets

SEMICONDUCTOR SUBSTRATE TREATING METHOD, SEMICONDUCTOR COMPONENT AND ELECTRONIC APPLIANCE

CROSS-REFERENCE

The entire disclosure of Japanese Patent Applications No. 2004-370228 filed on Dec. 21, 2004 and No. 2005-274764 filed on Sep. 21, 2005 are expressly incorporated by reference herein.

BACKGROUND OF THE INVENTION

1. Field of the Invention

The present invention is directed to a semiconductor substrate treating method, a semiconductor component and an electronic appliance.

2. Description of the Prior Art

In recent years, the requirement for higher degree of integration of devices makes a strong demand for increased cleanliness of the surface of semiconductor substrates (semiconductor wafers).

Presence of particulate contaminants such as silicon particles, dusts or the like (collectively referred to as "particles") on the surface of the semiconductor substrates may cause disconnection or short-circuit of a device wiring. In the meantime, contamination of the semiconductor substrate surface with metal-based contaminants inclusive of transition metal may give rise to problems such as creation of oxide-induced stacking fault and shortened life time. For that reason, cleaning is conducted to remove these contaminants from the semiconductor substrate surface, in which cleaning process care should be taken to avoid re-contamination.

Examples of the conventional methods for cleaning a semiconductor substrate include: (1) cleaning the substrate with an aqueous solution of dilute hydrofluoric acid; (2) cleaning the substrate with an aqueous solution of the mixture of hydrogen peroxide and hydrochloric acid or sulfuric acid; and (3) cleaning the substrate with an aqueous solution of the mixture of ammonia and hydrogen peroxide. Used as a cleaning fluid in these methods are chemicals or water of high purity from which particulate contaminants and metal-based contaminants were eliminated as much as possible.

Among the prior art cleaning methods noted above, method (1) exhibits an excellent ability to remove or dissolve such contaminants as oxides but has a difficulty in reducing particulate contaminants. Furthermore, with respect to a semiconductor substrate having an oxide film, method (1) shows low selectivity between oxides targeted for removal and oxide films to be survived intact, as a result of which a problem is posed in that not only the target oxides but also the oxide films are dissolved or etched away unintentionally.

Method (2) takes advantage of the enhanced ability of the cleaning solution to dissolve metal-based contaminants but has no capability of dissolving oxides.

Thanks to its action to dissolve silicon per se, method (3) is capable of effectively removing particulate contaminants, resist residues and etching reaction products that subsist on the substrate. However, method (3) has a tendency to introduce metal-based contaminants into the cleaning fluid, which increases the possibility of re-contamination of the semiconductor substrate in the cleaning process. Additionally, it is known that method (3) tends to dissolve metal of high melting point, such as W (tungsten), and roughen a silicon substrate surface to thereby increase roughness thereof, thus deteriorating the performance of semiconductor devices produced.

As a solution to the afore-mentioned problems inherent in the prior art methods, what is called a "slight etching method" has been proposed whereby a semiconductor substrate (silicon wafer) is cleaned by soaking it into an aqueous solution of the mixture of 60 wt % of nitric acid and 0.1 wt % or less of hydrogen fluoride. Reference is made to, for example, an article, Rituo Takizawa, et al., "Extended Abstracts of Solid State Devices and Materials," 1988, P. 475. In view of the fact that ultra-pure nitric acid graded for semiconductor use contains metal-based contaminants, e.g., Al, Ca, Cu, Fe, K, Na and Za, on the order of ppb or sub-ppb, the concentration of the metal-based contaminants remains significantly high in the cleaning fluid that contains as much nitric acid as 60 wt %. Moreover, in case of using a cleaning bath made of quartz glass, metallic impurities are eluted from the quartz glass bath and thereby further increase the concentration of the metal-based contaminants. Owing to the strong oxidizing action exercised by nitric acid of increased concentration, an oxide film is formed on the surface of the semiconductor substrate, in which process the metal-based contaminants present in the cleaning fluid are apt to infiltrate into the oxide film. This means that the slight etching method also has a limit in cleaning silicon wafers with a high degree of cleanliness.

In addition to the above, there has been proposed a cleaning method that makes use of, as a cleaning fluid, an aqueous solution containing no less than 0.10 wt % of hydrochloric acid, 0.05 to 10 wt % of hydrogen fluoride and 0.05 to 10 wt % of hydrogen peroxide. Reference is made to, for example, JP-B No. H8-18920. In case of using this kind of cleaning fluid, however, a drawback is observed in that, as with the aqueous solution of dilute hydrofluoric acid, the oxide films to be survived intact are dissolved unintendedly. Furthermore, this cleaning fluid has a property of dissolving high melting point metal, such as W (tungsten), and therefore cannot be employed in cleaning semiconductor substrates that comprise high melting point metal as their elements (e.g., semiconductor substrates having a gate electrode composed of such materials as W or the like).

SUMMARY OF THE INVENTION

Accordingly, it is an object of the present invention to provide a semiconductor substrate treating method that can selectively remove contaminants, such as particulate contaminants, resist residues and etching reaction products, subsisting on the surface of a semiconductor substrate and, particularly, can remove contaminants or unnecessary substances while effectively preventing any unintentional removal of an oxide film (in particular, a thermally oxidized film) or other need-to-survive regions composed of Si, poly-Si, high melting point metal or the like.

Another object of the present invention is to provide a semiconductor component of enhanced reliability produced by the above method.

A further object of the present invention is to provide an electronic appliance incorporating the semiconductor component noted just above and exhibiting an increased reliability.

With these objects in view, according to one aspect of the present invention, there is provided a semiconductor substrate treating method, comprising the step of treating a semiconductor substrate with a treating fluid containing $NH_4OH$ and HF wherein the relationships $0.30 \leq X/Y \leq 0.78$ and $0.03 \leq Y \leq 6.0$ are satisfied, where X represents a concentration [mol/L] of $NH_4OH$ in the treating fluid and Y represents a concentration [mol/L] of HF in the treating fluid.

This method makes it possible to selectively remove contaminants or unnecessary substances, such as particulate contaminants, resist residues and etching reaction products, subsisting on the surface of a semiconductor substrate. Particularly, the method can remove contaminants or unnecessary substances while effectively preventing any unintentional removal of an oxide film (in particular, a thermally oxidized film) or other need-to-survive regions composed of Si, poly-Si, high melting point metal or the like.

In the semiconductor substrate treating method according to the present invention, it is desirable that the treating fluid be used to remove an oxide film formed by a gas phase method and subsisting on the semiconductor substrate.

Conventionally, in the event that a semiconductor substrate targeted for treatment has an oxide film formed by a gas phase method and a thermally oxidized film, for example, the etching selectivity of the gas phase oxide film is too low to permit selective removal of the oxide film. According to the method of the present invention, it becomes possible to remove the gas phase oxide film without adversely affecting the thermally oxidized film or the like.

In the semiconductor substrate treating method according to the present invention, it is desirable that the relationships $0.30 \leq X/Y \leq 0.43$ and $0.03 \leq Y \leq 6.0$ be satisfied, where X represents a concentration [mol/L] of $NH_4OH$ in the treating fluid and Y represents a concentration [mol/L] of HF in the treating fluid.

This assists in efficiently removing a gas phase oxide film present on the surface of a semiconductor substrate, while effectively preventing need-to-survive regions from suffering damage. More specifically, it becomes possible to efficiently remove the gas phase oxide film, while effectively preventing a thermally oxidized film or the like present on the surface of a semiconductor substrate from suffering damage. This means that oxide films, in spite of the similarity in nature, can be selectively removed depending on the difference in their forming methods.

In the semiconductor substrate treating method according to the present invention, it is desirable that the treating fluid be used to remove an etching reaction product or a modified substance of the reaction product subsisting on the semiconductor substrate.

Reliability of a semiconductor component produced is drastically reduced if an etching reaction product or modified substances thereof continues to subsist on the surface of a semiconductor substrate. According to the method of the present invention, it becomes possible to remove the etching reaction product or the modified substances thereof without adversely affecting other parts of the semiconductor substrate.

In the semiconductor substrate treating method according to the present invention, it is desirable that the relationships $0.43 \leq X/Y \leq 0.78$ and $0.03 \leq Y \leq 6.0$ be satisfied, where X represents a concentration [mol/L] of $NH_4OH$ in the treating fluid and Y represents a concentration [mol/L] of HF in the treating fluid.

This makes it possible to efficiently remove an etching reaction product or modified substances thereof present on the surface of a semiconductor substrate, while effectively preventing need-to-survive regions from suffering damage.

In the semiconductor substrate treating method according to the present invention, it is desirable that the treating fluid be prepared by admixing at least a first liquid containing $NH_4OH$ and a second liquid containing HF within an apparatus for treating the semiconductor substrate.

This assures that the concentration ratio of $NH_4OH$ and HF in the treating fluid is adjusted in an easy and positive manner and further that the concentration ratio of $NH_4OH$ and HF or the like is readily and reliably changed depending on the kind of a semiconductor substrate targeted for treatment or other conditions.

In the semiconductor substrate treating method according to the present invention, it is desirable that the treating fluid be prepared by admixing at least a first liquid containing $NH_4OH$, a second liquid containing HF and deionized water within an apparatus for treating the semiconductor substrate.

This makes sure that the concentration ratios of $NH_4OH$ and HF in the treating fluid are adjusted in an easy and reliable manner and further that the concentrations of $NH_4OH$ and HF, the concentration ratios of $NH_4OH$ and HF or the like are readily and reliably changed depending on the kind of a semiconductor substrate targeted for treatment or other conditions.

In the semiconductor substrate treating method according to the present invention, it is desirable that the treating fluid be substantially free from $H_2O_2$.

This ensures that, even when a semiconductor substrate (semiconductor component targeted for production) has regions composed of materials containing high melting point metal, e.g., W (tungsten), contaminants or unnecessary substances present on the surface of the semiconductor substrate are selectively removed while effectively preventing such regions from suffering damage by the treating fluid.

In the semiconductor substrate treating method according to the present invention, it is desirable that the semiconductor substrate has a surface, at least a part of which is composed of a metallic substance comprising high melting point metal.

With the prior art methods, it has been particularly difficult to selectively remove contaminants or unnecessary substances in such an instance that a semiconductor substrate has a surface, at least a part of which is composed of high melting point metal. According to the method of the present invention, it becomes possible to easily and reliably remove contaminants without adversely affecting other parts of the semiconductor substrate (particularly, those parts composed of high melting point metal).

In accordance with another aspect of the present invention, there is provided a semiconductor component produced by the method noted above. The semiconductor component thus produced exhibits an enhanced reliability.

In accordance with a further aspect of the present invention, there is provided an electronic appliance incorporating the semiconductor component set forth above. This electronic appliance has an increased reliability.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE PREFERRED EMBODIMENTS

Now, preferred embodiments of a semiconductor substrate treating method, a semiconductor component and an electronic appliance in accordance with the present invention will be described in detail with reference to the accompanying drawings.

Description will be made first regarding the preferred embodiments of a semiconductor substrate treating method and a semiconductor component, and then will shifted to an electronic appliance incorporating the semiconductor component.

Figure 1A:
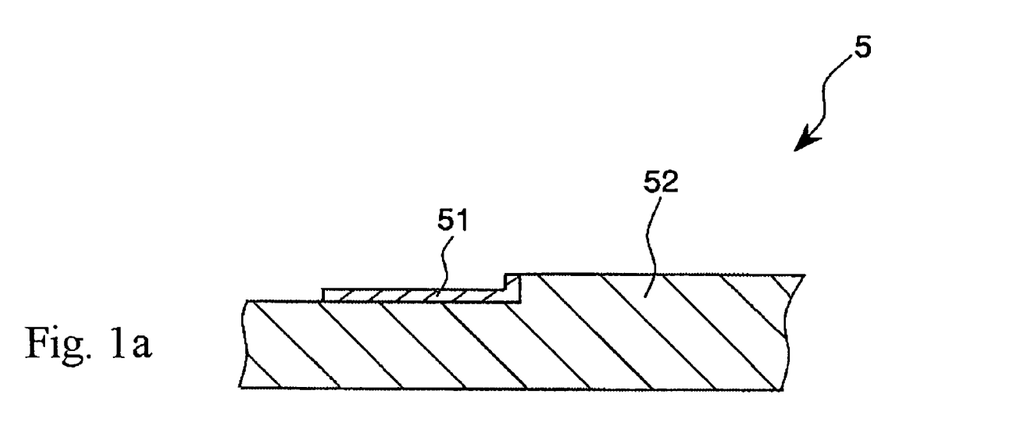
FIG. 1 is a section view illustrating a preferred embodiment of a semiconductor substrate treating method in accordance with the present invention.
Figure 1B:
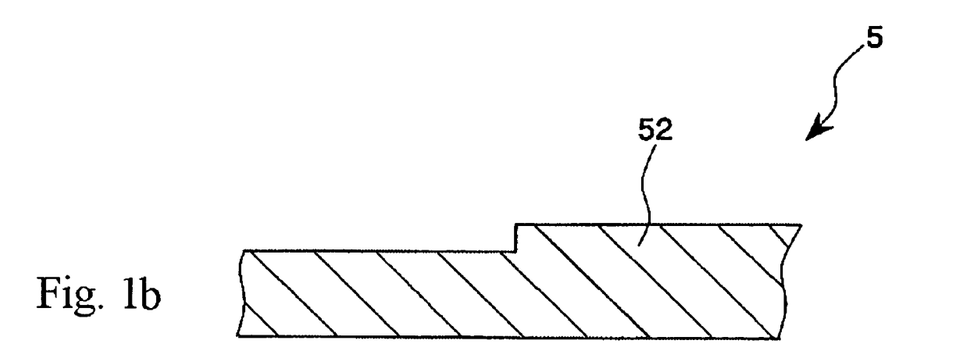

FIG. 1 is a section view illustrating a preferred embodiment of a semiconductor substrate treating method in accordance with the present invention. FIG. 1 (1a) shows a semiconductor substrate 5 having a need-to-remove part 51 on the surface thereof and FIG. 1 (1b) shows the semiconductor substrate 5 from which the need-to-remove part 51 has been removed by applying a treating fluid (removal fluid) which selectively removes the need-to-remove part 51.

[Semiconductor Substrate]

The semiconductor substrate 5, an object targeted for treatment, is mainly composed of a semiconductor material such as silicon or the like. Depending on circumstances, the semiconductor substrate 5 is provided with: conductive parts including a variety of wirings, electrodes and pads each composed of metallic substances; insulating parts or insulating layers including an oxide film, e.g., a thermally oxidized film or an oxide film formed by a gas phase method such as a CVD (for example, a film made of silicon oxide such as $SiO_2$) and a nitride film made of, e.g., silicon nitride; and a mask.

Such a semiconductor substrate 5 is used in producing the semiconductor component of the present invention described later. Stating differently, the semiconductor substrate 5 is converted to the below-noted semiconductor component by going through the treatment according to the method of the present invention (if needed, undergoing further treatment such as deposition, etching and the like).

As set forth above, the semiconductor substrate 5 has a need-to-remove part 51 on one surface thereof. And, a need-to-survive part 52 is provided on the remaining surface area at the side that the need-to-remove part 51 lies. The need-to-remove part 51 comprises, among other things, an etching product created by various kinds of etching treatments (particularly, CF-based gas dry etching), e.g., a fluorocarbon-based substance, an oxide of the fluorocarbon-based substance and a compound having a partial structure of Si—C—F—O, a residue of ashing treatment, and an oxide film formed by a gas phase method such as CVD.

[Treating Fluid Applying Process]

A treating fluid described below is applied to the semiconductor substrate 5 as set forth in the foregoing, whereby the need-to-remove part 51 of the semiconductor substrate 5 can be removed selectively. In other words, the need-to-remove part 51 can be removed while effectively preventing the other regions of the semiconductor substrate 5 than the need-to-remove part 51 from suffering damage by the treating fluid.

Examples of the methods for applying the treating fluid to the semiconductor substrate 5 include, but are not particularly limited to, application methods such as a doctor blade method, a brush-on method, a roll coater method, an ink jet method and the like, spraying methods with the use of a spray, dipping methods (dipping cleaning) and single wafer spin cleaning methods.

In this process, the treating fluid and the semiconductor substrate 5, for instance, may be heated up to raise the temperature thereof, whereby the need-to-remove part 51 can be removed with an increased efficiency. On this occasion, the heating temperature should be preferably 20 to 80° C. and more preferably 20 to 30° C., for example.

Furthermore, in the above process, the treating fluid and the semiconductor substrate 5, for instance, may be cooled down, whereby the need-to-remove part 51 can be removed reliably with a high selectivity. On this occasion, the cooling temperature should be preferably 0 to 20° C. and more preferably 4 to 15° C., for example.

In addition, during the above process, it is desirable that the treating fluid is applied to at least the surface of the semiconductor substrate 5 having the need-to-remove part 51.

Moreover, the instant process may be carried out in any atmosphere, including an oxidizing atmosphere, a reducing atmosphere and an inert atmosphere.

[Cleaning Process]

At the end of the treating fluid applying process described above, a cleaning process is usually performed for cleaning the semiconductor substrate 5 (semiconductor component) from which the need-to-remove part 51 has been removed. By way of this cleaning process, it becomes possible to effectively purge the treating fluid constituents, such as $NH_4OH$ ($NH_3$), HF and the like, present on the surface of the semiconductor substrate 5 (semiconductor component). This remarkably enhances the reliability of the semiconductor component acquired consequently.

[Treating Fluid]

The treating fluid employed in the present invention contains $NH_4OH$ and HF. Content of these substances is selected such that the relationships $0.30 \leq X/Y \leq 0.78$ and $0.03 \leq Y \leq 6.0$ can be satisfied, where X represents a concentration [mol/L] of $NH_4OH$ in the treating fluid and Y represents a concentration [mol/L] of HF in the treating fluid. A primary feature of the present invention resides at the finding that need-to-remove parts of a semiconductor substrate can be selectively removed by using the treating fluid containing $NH_4OH$ and HF at a prescribed concentration ratio. Particularly, the present invention was derived from the finding that need-to-remove parts can be reliably removed without causing damage to need-to-survive parts, even when the need-to-survive parts are composed of those substances highly vulnerable to damage by the conventional treating fluid, e.g., an oxide film (particularly, a thermally oxidized film), a high melting point metallic material inclusive of W (tungsten), Si and polysilicon. The treating fluid that satisfies the above-noted inequity relationships has a pH higher than that of HF. Accordingly, if the semiconductor substrate is treated with the treating fluid satisfying the above relationships, it becomes possible to prevent, more effectively than HF, re-adherence to the semiconductor substrate surface of the materials already removed by the treating fluid, such as residues of a polymer, modified products thereof, particles and the like. This is apparent from the zeta potential of the treating fluid. As a result, the semiconductor component produced exhibits an increased reliability.

In addition, according to the method of the present invention, the semiconductor substrate can be efficiently treated through simplified operations without having to use a bulky apparatus. Omission of the bulky apparatus assists in, for example, efficiently conducting a series of operations for producing the semiconductor component.

By the way, if the value of X/Y is less than the lower limit or greater than the upper limit in the above inequity relationships, it becomes difficult to selectively remove the need-to-remove part. Specifically, in the event that the value of X/Y is less than the lower limit or greater than the upper limit, the need-to-remove part is not reliably removed or the need-to-survive part is adversely affected by, e.g., unintentional removal of the need-to-survive part together with the need-to-remove part.

As set forth above, it is desirable in the present invention that the concentration X [mol/L] of $NH_4OH$ and the concentration Y [mol/L] of HF in the treating fluid should satisfy the relationships $0.30 \leq X/Y \leq 0.78$ and $0.03 \leq Y = 6.0$. The value of X/Y may be properly adjusted depending on the combinations of the need-to-remove part 51 and the need-to-survive part 52 that the semiconductor substrate 5 is provided with.

By way of example, if the need-to-remove part 51 is an oxide film formed by a gas phase method (e.g., a silicon oxide film), it is preferable to satisfy the relationship $0.30 \leq X/Y \leq 0.43$ and more preferable to meet the relationship $0.37 \leq X/Y \leq 0.41$. This ensures that the need-to-remove part 51 is removed efficiently (easily within a shortened period of time) while effectively preventing the need-to-survive part 52 from suffering damage by the treating fluid. Even in a case that the semiconductor substrate 5 has a thermally oxidized film, the need-to-remove part 51 can be removed with an increased efficiency while effectively preventing the thermally oxidized film from suffering damage by the treating fluid. This means that oxide films, in spite of their similarity in nature, can be selectively removed depending on the difference in their forming methods. On the contrary, if the value of X/Y is less than the lower limit or greater than the upper limit, the etching selectivity gets reduced between the thermally oxidized film and the oxide film formed by a gas phase method, thereby disadvantageously increasing the damage to the thermally oxidized film.

In the meantime, if the need-to-remove part 51 is composed of an etching reaction product or modified substances thereof (e.g., a residue created by CF-based gas dry etching or a fluorocarbon-based substance, an oxide of the fluorocarbon-based substance and a compound having a partial structure of Si—C—F—O, each created by the dry etching), it is preferable to satisfy the relationship $0.43 \leq X/Y \leq 0.78$ and more preferable to meet the relationship $0.43 \leq X/Y \leq 0.50$. This makes sure that the need-to-remove part 51 is removed efficiently (easily within a shortened period of time) while effectively preventing the need-to-survive part 52 from suffering damage by the treating fluid. Even in a case that the semiconductor substrate 5 has an oxide film (e.g., silicon oxide film) as the need-to-survive part 52, the need-to-remove part 51 can be removed with an increased efficiency while suppressing the etching rate for the oxide film to a minimized level. On the contrary, if the value of X/Y is less than the lower limit, there exists a possibility that an oxide film present in the need-to-survive part 52 is unintentionally etched away, thus magnifying damage to the need-to-survive part 52. If the value of X/Y is greater than the upper limit, there exists a possibility that Si or poly-Si present in the need-to-survive part 52 is unintentionally etched away, thus causing heavy damage to the need-to-survive part 52.

Furthermore, the concentrations of respective constituents of the treating fluid applied in the treating fluid applying process may be either substantially constant throughout the process or may be caused to change over time. Taking an example, the concentrations of the respective treating fluid constituents can be changed stepwise or continuously by varying over time the mixed ratio of a first liquid and a second liquid (additionally and optionally, deionized water) which will be described later.

It is desirable in the present invention that the treating fluid be substantially free from $H_2O_2$. This ensures that, even when the need-to-survive part 52 is composed of those materials containing high melting point metal, e.g., W (tungsten), the need-to-remove part 51 is selectively removed while reliably preventing the need-to-survive part 52 from suffering damage by the treating fluid.

The treating fluid applied to the semiconductor substrate 5 may be either prepared in advance or belatedly prepared within, e.g., an apparatus for carrying out the treating fluid applying process (within a cleaning apparatus). If the treating fluid is prepared within the apparatus for carrying out the treating fluid applying process (within a cleaning apparatus) as noted above, it becomes possible to easily and reliably adjust the concentration ratio of $NH_4OH$ and HF in the treating fluid. In addition, it is possible to easily and reliably change the concentration ratio of $NH_4OH$ and HF for other process conditions in conformity with the kind of the semiconductor substrate 5 to be treated or the like. Moreover, as compared to the case of using a treating fluid prepared in advance by blending $NH_4OH$ and HF at a prescribed ratio, the semiconductor component can be produced in more cost-effective manner. Examples of the method for preparing the treating fluid within the apparatus for carrying out the treating fluid applying process (within a cleaning apparatus) include a method of admixing at least a first liquid containing $NH_4OH$ and a second liquid containing HF. Use of such a preparation method makes the afore-mentioned beneficial effects conspicuous. If, for the purpose of preparing the treating fluid, deionized water is used in addition to the first liquid containing $NH_4OH$ and the second liquid containing HF, it becomes possible to reduce the concentrations of the first liquid containing $NH_4OH$ and the second liquid containing HF while providing the same beneficial effects as in the case of not using the deionized water. This makes it possible to readily carry out the process for cleaning the semiconductor substrate 5 (semiconductor component) from which the need-to-remove part 51 has been removed, which cleaning process is typically conducted at the end of the treating fluid applying process. By virtue of this, removal can be performed rapidly for the treating fluid constituents, such as $NH_4OH(NH_3)$, HF and the like, which may continue to subsist on the surface of the semiconductor substrate 5 (semiconductor component). Additionally and optionally, the apparatus for carrying out the treating fluid applying process (cleaning apparatus) may be provided with receiver parts each for receiving the first liquid, the second liquid and optionally the deionized water and a mixing part (mixing tank) for admixing these materials. This ensures that a quite uniformly mixed treating fluid is applied to the semiconductor substrate while assuring the beneficial effects noted above. Examples of the first liquid include ammonia water and examples of the second liquid include hydrofluoric acid.

[Semiconductor Component]

A semiconductor component of the present invention is acquired by carrying out the afore-mentioned treatment according to the method of the present invention.

The semiconductor component thus produced exhibits an increased reliability because contaminants or unnecessary substances that may have an adverse effect on the quality of the semiconductor component were removed in a trustworthy manner.

Although the treating fluid applying process was performed only once in the foregoing description, it would be possible to carry out the treating fluid applying process multiple times in producing the semiconductor component. For example, first and second treating fluid applying processes may be performed respectively before and after a deposition, oxidizing or other treatment process. This assists in producing a semiconductor component that shows an increased reliability. Furthermore, a sufficiently high reliability can be attained even in case of producing a semiconductor component of complicated structure.

In the event that the treating fluid applying process is conducted multiple times as described above, each process may be performed either substantially on the same condition or differing conditions, in the latter case of which the concentrations of respective constituents of the treating fluid may be changed on a process-by-process basis.

Description will now be offered regarding more specific embodiments of the present invention.

FIG. 2 is a section view illustrating an instance that the method of the present invention is employed to produce a semiconductor component with polymetal gate electrodes.

Initially, as shown in FIG. 2 (2a), a gate oxide film 62 is formed on a silicon substrate 61 by a thermal oxidization method, after which materials for a polymetal gate electrode, i.e., a polysilicon film 631, a tungsten nitride film 632 and a tungsten film 633 are deposited on the gate oxide film 62 in the named sequence. Then, a silicon nitride film 64 is deposited on the tungsten film 633 and a resist pattern 65 is formed on the silicon nitride film 64 so as to cover a gate electrode formation region.

Subsequently, as illustrated in FIG. 2 (2b), by using the resist pattern 65 as a mask, dry etching is sequentially conducted with respect to the silicon nitride film 64, the tungsten film 633, the tungsten nitride film 632 and the polysilicon film 631 so that a polymetal gate electrode 63 consisting of the polysilicon film 631, the tungsten nitride film 632 and the tungsten film 633 can be formed on the silicon substrate 61 through the intermediary of the gate oxide film 62.

Then, as shown in FIG. 2 (2c), the resist pattern 65 is dislodged by ashing.

Figure 2A:
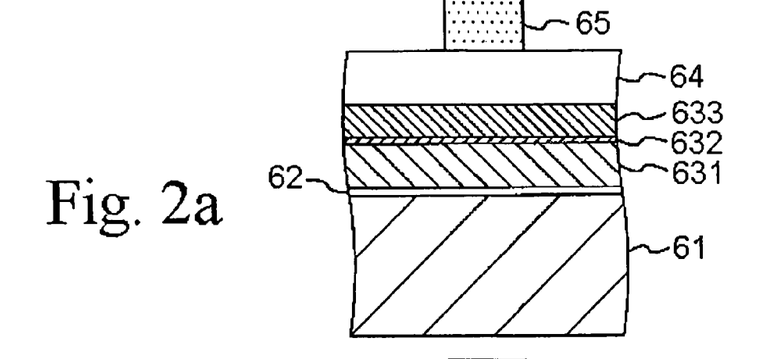
FIG. 2 is a section view illustrating an instance that the method of the present invention is employed to produce a semiconductor component with polymetal gate electrodes.
Figure 2B:
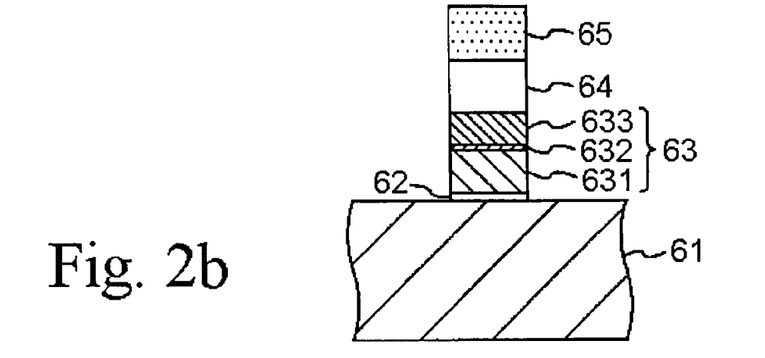
Figure 2C:
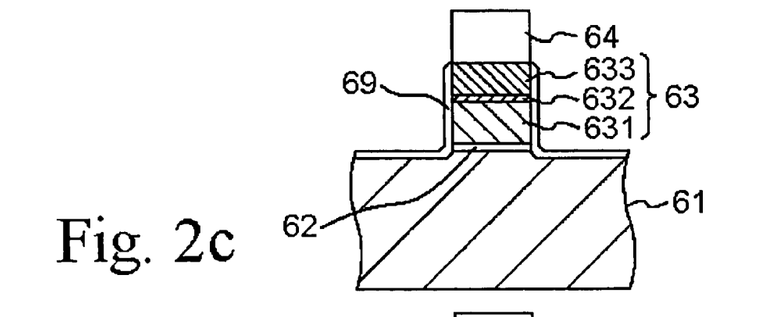
Figure 2D:
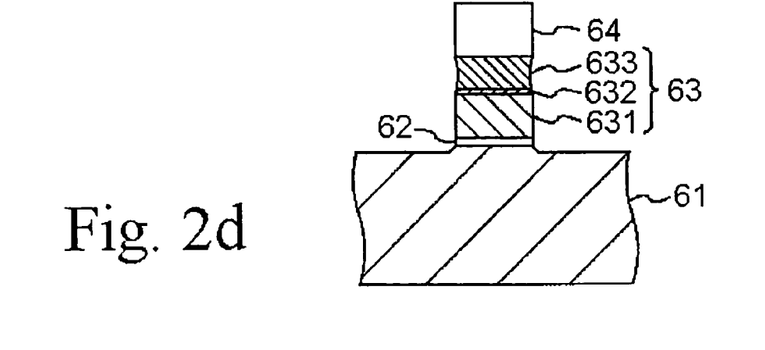

The next step is to clean the silicon substrate 61 through the use of the treating fluid as set forth above. This removes unnecessary substances 69 such as resist residues, particles, polymers (dry-etched polymers) and the like, as can be seen in FIGS. 2 (2c) and 2 (2d). Particularly, this can remove the afore-mentioned unnecessary substances (need-to-remove part) 69 in a reliable manner without adversely affecting the need-to-survive part (e.g., the tungsten nitride film 632 and the tungsten film 633 of which the polymetal gate electrode 63 is composed).

Although tungsten (W) was used as a high melting point metal in the foregoing description, it would be possible to use, as the high melting point metal, Mo, Ta or the like, for example. Examples of other materials available for use as the high melting point include films made of silicides of W, Mo, Ta and Ti ($WiSi_x$, $MoSi_x$, $TaSi_x$ and $TiSi_x$), nitrides of W, Mo, Ta and Ti, and metallic substances such as Al, AlCu, AlSiCu, Cu and the like.

Description will now be made regarding how to produce a complementary metal oxide semiconductor (CMOS) by the method of the present invention.

FIGS. 3 and 4 are section views showing an instance that the method of the present invention is employed to produce a complementary metal oxide semiconductor.

Figure 3A:
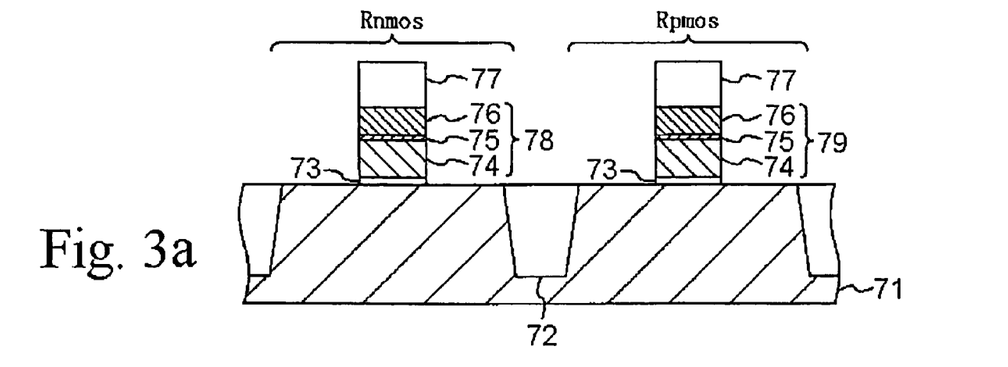
FIG. 3 is a section view showing an instance that the method of the present invention is employed to produce a complementary metal oxide semiconductor (CMOS)

An element isolation 72 consisting of a shallow trench isolation (STI) is formed on the silicon substrate 71 to define an n-type MOSFET formation region Rnmos and a p-type MOSFET formation region Rpmos, as depicted in FIG. 3 (3a). Then, a gate insulating film 73 made of a silicon oxide film, a polysilicon film 74, a barrier metal film 75, a high melting point metal film 76, including a tungsten film for instance, and a silicon nitride film 77 are deposited on the silicon substrate 71 in the named order. What to do next is to conduct etching with respect to the silicon nitride film 77 through the use of a resist pattern (not shown) covering the gate electrode formation region. Then the resist pattern is dislodged by ashing, after which the high melting point metal film 76, the barrier metal film 75, the polysilicon film 74 and the gate insulating film 73 are etched by taking advantage of the patterned silicon nitride film 77 (hard mask). Thus, as shown in FIG. 3 (3a), first and second gate electrodes 78, 79, each of which is composed of the polysilicon film 74, the barrier metal film 75 and the high melting point metal film 76, are formed respectively on the n-type MOSFET formation region Rnmos and the p-type MOSFET formation region Rpmos.

Figure 3B:
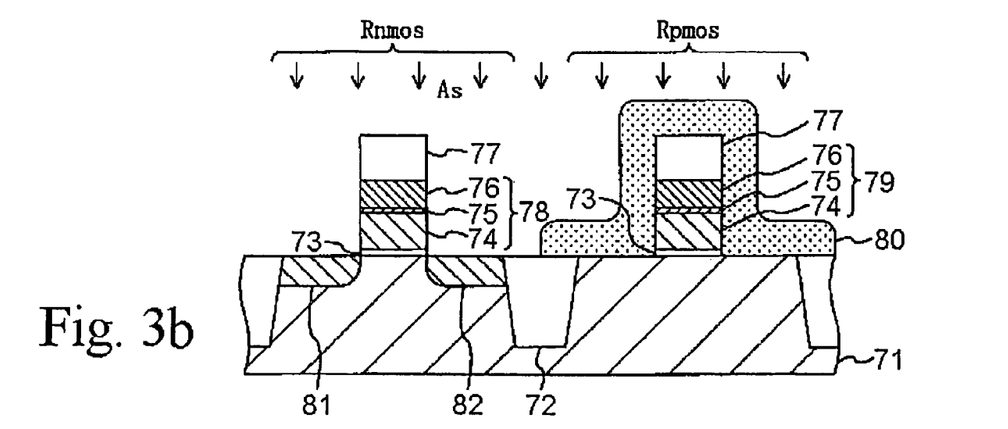

Subsequently, as shown in FIG. 3 (3b), a first resist pattern 80 is formed so as to cover the p-type MOSFET formation region Rpmos including the top of the second gate electrode 79, after which n-type impurities (e.g., arsenic) are implanted into the silicon substrate 71 by using the first resist pattern 80 and the first gate electrode 78 as a mask. This creates a first source region 81 and a first drain region 82 in the n-type MOSFET formation region Rnmos.

Figure 3C:
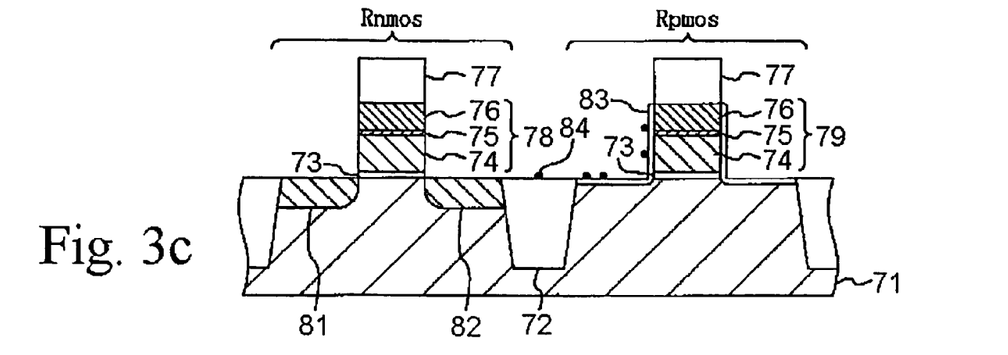

Thereafter, as illustrated in FIG. 3 (3c), the first resist pattern 80 is removed by oxygen plasma ashing. At this time, a thin oxide film 83 is formed on the surface of the silicon substrate 71 or on the surfaces of the polysilicon film 74 and the high melting point metal film 76 of which the second gate electrode 79 is composed, and particles 84 subsist on the top of the element isolation 72 or at one flank side of the second gate electrode 79. A particularly large number of particles 84 tend to subsist on the top of the element isolation 72, due to the fact that the end part of the first resist pattern 80 lying above the element isolation 72 is highly susceptible to damage at the time of implantation of the impurities (e.g., arsenic) noted above.

Figure 4A:
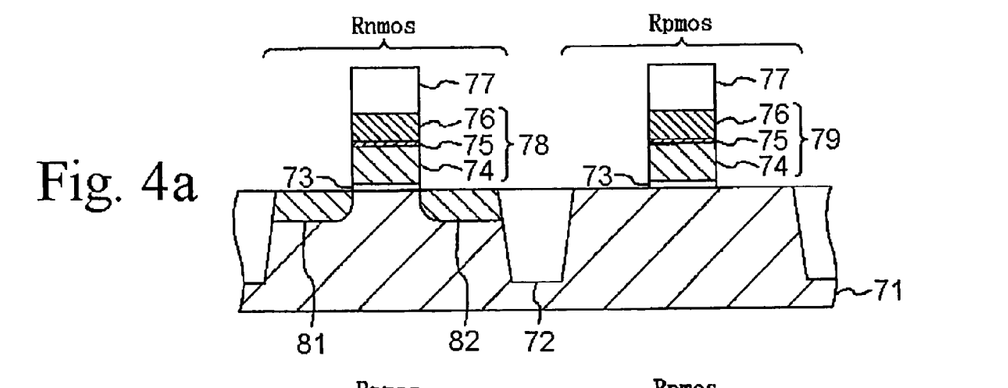
FIG. 4 is a section view showing an instance that the method of the present invention is employed to produce a complementary metal oxide semiconductor.

According to the present invention, after the first resist pattern 80 has been removed by ashing, a cleaning treatment is conducted with the afore-mentioned treating fluid as shown in FIG. 4 (4a) whereby the oxide film 83 and the particles 84 can be removed with an increased efficiency. This makes it possible to clean the surface of the silicon substrate 71 with certainty.

Figure 4B:
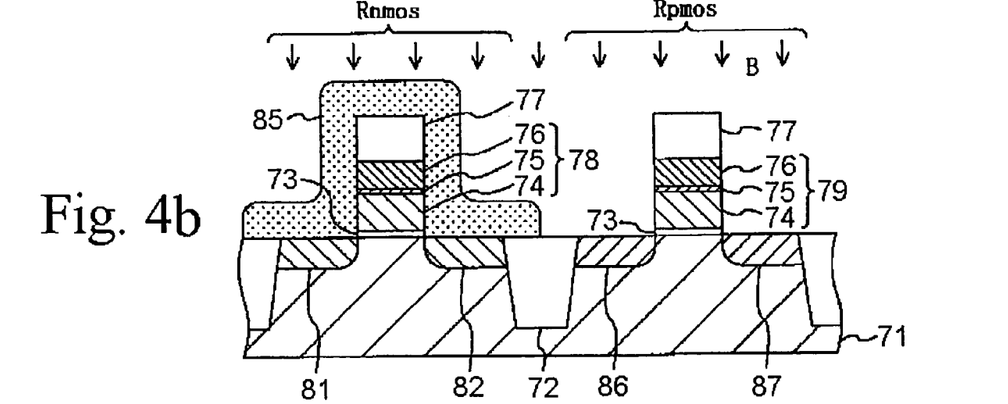

Subsequently, as shown in FIG. 4 (4b), a second resist pattern 85 is formed so as to cover the n-type MOSFET formation region Rnmos including the top of the first gate electrode 78, after which p-type impurities, e.g., boron, are implanted into the silicon substrate 71 by using the second resist pattern 85 and the second gate electrode 79 as a mask. This creates a second source region 86 and a second drain region 87 in the p-type MOSFET formation region Rpmos.

Figure 4C:
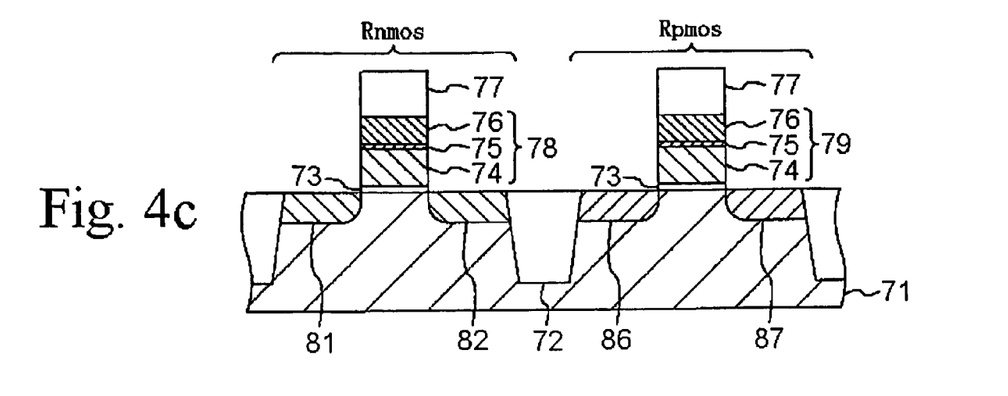

Thereafter, as illustrated in FIG. 4 (4c), the second resist pattern 85 is removed by oxygen plasma ashing, after which the surface of the silicon substrate 71 is cleaned through treatment with the afore-mentioned treating fluid.

By way of the processes described above, a CMOS is acquired that has an n-type MOSFET and a p-type MOSFET.

According to the present embodiment, the substrate having gate electrodes is cleaned with the treating fluid described above. Accordingly, as compared to the case of conducting the cleaning with a treating fluid containing, e.g., hydrogen peroxide solution, it is possible not only to greatly reduce the etching rate of high melting point metal but also to remove, with increased certainty, particles, resist residues, polymers and the like. This assures that the substrate is reliably cleaned while preventing dissolution of the high melting point metal contained in the gate electrodes. As a result, a semiconductor component with an increased reliability can be acquired in a trustworthy fashion.

Description will now be shifted to an electronic appliance (electronic device) produced by the method of the present invention set forth in the foregoing.

The electronic appliance in accordance with the present invention incorporates the semiconductor component that was produced by the afore-mentioned method of the invention. Examples of such an electronic appliance include a liquid crystal panel, a projection display apparatus (liquid crystal projector) provided with the liquid crystal panel, a personal computer, a cellular phone, a digital still camera, an ink jet type ejecting device (e.g., an ink jet printer), a television set, a video tape recorder, a car navigation device, a pager, an electronic pocket diary (possibly with a function of communication), an electronic desktop calculator, an electronic game device, a word processor, a work station, a television phone, a television monitor for crime prevention, an electronic binoculars, a POS terminal, medical instruments (e.g., an electronic clinical thermometer, a sphygmomanometer, a blood sugar tester, an electrocardiogram measuring device, a sonogram and an electronic endoscope), a fish finder, a variety of measuring devices, varying kinds of gauges (e.g., gauges for automotive vehicles, airplanes and ships) and a flight simulator.

Although the semiconductor substrate treating method, the semiconductor component and the electronic appliance of the present invention were described hereinabove with reference to the accompanying drawings, it should be appreciated that the invention is not limited to the embodiments illustrated in the drawings.

Taking an example, one or more process for an arbitrary purpose may be added in the method of the present invention. Specifically, a cleaning process may be further included that makes use of a treating fluid other than the treating fluid set forth above.

Moreover, although a treating fluid containing $NH_4OH$ and HF was used in the foregoing description, the treating fluid may further comprise other constituents such as $O_3$ or the like.

DESCRIPTION OF EXAMPLES

Example 1

Production of Semiconductor Substrate

A silicon substrate was prepared in advance. The silicon substrate was subject to thermal oxidization treatment in an atmosphere of mixed gases Of $O_2$ and $N_2$ for 47 minutes at a temperature of 750° C., thereby forming an oxide film on the surface of the silicon substrate. The thickness of the oxide film was 5.5 nm.

Thereafter, a TEOS film (CVD film) having a thickness of 20 nm was deposited on the thermally oxidized film in an atmosphere of Si $(OC_2H_5)_4$ gases, under a pressure of 0.10 kPa, for 4.9 minutes and at a temperature of 660° C. Additionally, a $Si_3N_4$ film having a thickness of 150 nm was deposited on the TEOS film in an atmosphere of mixed gases of $SiH_2Cl_2$, $NH_3$ and $N_2$, under a pressure of 0.03 Pa, for 59 minutes and at a temperature of 760° C. Then, a resist mask was clad on the surface of the oxide film.

Subsequently, those parts of the $Si_3N_4$ film that are not clad with the resist mask were completely dislodged by dry etching with the use of CF-based gases (mixed gases of $CF_4$, $O_2$, HBr and $Cl_2$). The thickness of the oxide film (in those parts not clad with the resist mask) was 15 nm when measured at the end of the dry etching. The thermally oxidized film and the TEOS film have survived the etching process.

Then, the resist mask was removed by $O_2$ gas ashing to acquire a semiconductor substrate which is to be used in the following treatment (treatment with a treating fluid). Unnecessary substances such as modified substances of the resist mask, residues and the like were present on the surface of the semiconductor substrate (silicon substrate with an oxide film) that has been subject to the ashing.

[Treatment by Treating Fluid]

The semiconductor substrate thus acquired was treated with a treating fluid containing a predetermined ratio of HF and $NH_4OH$. The treatment with the treating fluid was conducted in the following manner.

At an initial step, the semiconductor substrate acquired in the above process was fixedly secured to a treatment stage of a single wafer spin cleaning apparatus and caused to rotate together with the stage, during which time a treating fluid composed of the mixture of a first liquid containing $NH_4OH$, a second liquid containing HF and deionized water was applied to the semiconductor substrate from a nozzle. The treating fluid was prepared in such a manner that the first liquid, the second liquid and the deionized water are admixed with one another in a mixing part midway of a pipe arrangement. The time of treatment with the treating fluid was one minute. The first liquid used was ammonia water (the mixture of ammonia and deionized water) whose $NH_4OH$ concentration is equal to 7.45 [mol/L] and the second liquid used was hydrofluoric acid (the mixture of hydrogen fluoride and deionized water) whose HF concentration is equal to 28.65 [mol/L]. The flow rates of the respective liquids mixed in the mixing part were controlled in such a manner that the first liquid has a flow rate of 35 ml/min, the second liquid 20 ml/min and the deionized water 2,000 ml/min. Specifically, the flow rate control was made to ensure that the ratio (X/Y) between the concentration X [mol/L] of $NH_4OH$ and the concentration Y [mol/L] of HF in the treating fluid is equal to 0.46, with X=0.129 and Y=0.28.

Thereafter, the first liquid and the second liquid were stopped from supplying and the semiconductor substrate was washed with the deionized water (water-cleaned). Observation of the semiconductor substrate treated in the above manner revealed the facts that the oxide film (those parts not clad with the resist mask) has a thickness of 5.4 nm, the TEOS film was removed and the thermally oxidized film was survived substantially with no damage incurred.

[Removal of Oxide Film by Wet Etching]

Figure 5:
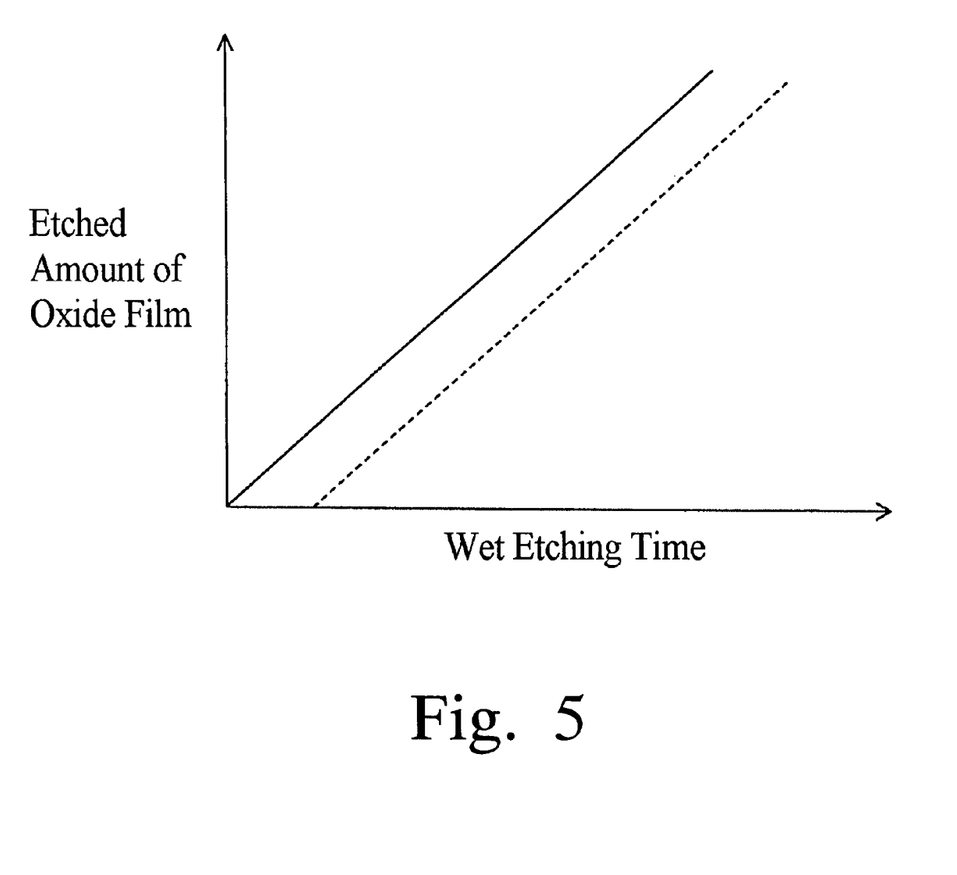
FIG. 5 is a graphical representation illustrating the time-dependent change of etching amount of an oxide film at the time when a semiconductor substrate from which a resist mask is removed was treated with treating fluid.

The semiconductor substrate (semiconductor component) subjected to the above treatment was wet etched with thin hydrofluoric acid, after which the correlation between the wet etching time and the etched amount of the oxide film was investigated. As illustrated with a solid line in FIG. 5, the rectilinear line indicative of the correlation between the wet etching time and the etched amount of the oxide film passes through the zero point. This means that unnecessary substances (contaminants) such as modified substances of the resist mask, residues and the like were certainly removed by the treatment using the treating fluid noted above.

And, a plurality of semiconductor substrates were produced in the same manner as described above except that the concentrations of $NH_4OH$ and HF in the treating fluid have been changed as shown in Table 1. The semiconductor substrates thus produced were treated with the treating fluid and then water-cleaned in the same fashion as noted above. The result is that, in case of using a treating fluid whose $NH_4OH$ concentration X [mol/L] and HF concentration Y [mol/L] meet the relationship $X/Y<0.30$ or $X/Y>0.78$, those parts of the oxide film dry etched by CF-based gases were removed to thereby expose the base silicon. In other words, in the event of employing a treating fluid that meets the relationship $X/Y<0.30$ or $X/Y>0.78$, the oxide film, one of need-to-survive parts, was removed thus causing damage to the semiconductor substrate.

Subsequently, these semiconductor substrates (semiconductor components) were wet etched with thin hydrofluoric acid, after which the correlation between the wet etching time and the etched amount of the oxide film was investigated. In Table 1 shown below, the mark "O" represents that, as represented with a solid line in FIG. 5, the rectilinear line indicative of the correlation between the wet etching time and the etched amount of the oxide film passes through the zero point, whereas the mark "X" means that, as represented with a broken line in FIG. 5, the rectilinear line indicative of the correlation between the wet etching time and the etched amount of the oxide film does not pass through the zero point. The concentrations of $NH_4OH$ and HF were changed by varying the quantities of the respective liquids (first liquid, second liquid and deionized water) supplied from the corresponding nozzles.

As is apparent in Table 1, the rectilinear line indicative of the correlation between the wet etching time and the etched amount of the oxide film passes through the zero point, in case of using a treating fluid whose $NH_4OH$ concentration X [mol/L] and HF concentration Y [mol/L] satisfy the relationships $0.30 \leq X/Y \leq 0.78$ and $0.03 \leq Y \leq 6.0$. On the contrary, the rectilinear line indicative of the correlation between the wet etching time and the etched amount of the oxide film does not pass through the zero point, in case of employing a treating fluid whose $NH_4OH$ concentration X [mol/L] and HF concentration Y [mol/L] meet the relationship $X/Y<0.30$ or $X/Y>0.78$. This means that unnecessary substances (contaminants) such as modified substances of the resist mask, residues and the like are not certainly removed if such a treating fluid is employed.

Example 2

Production of Semiconductor Substrate

A silicon substrate was prepared in advance. The silicon substrate was subject to thermal oxidization treatment in an atmosphere of mixed gases of $O_2$ and $N_2$ for 47 minutes at a temperature of 750° C., thereby forming a thermally oxidized film on the surface of the silicon substrate. The thickness of the thermally oxidized film was 5.5 nm.

Thereafter, a TEOS film (CVD film) having a thickness of 10 nm was deposited on the thermally oxidized film in an atmosphere of Si $(OC_2H_5)_4$ gases, under a pressure of 0.10 kPa, for 2.5 minutes and at a temperature of 660° C. Additionally, a poly-Si film having a thickness of 200 nm was deposited on the TEOS film in an atmosphere of $SiH_4$ gases, under a pressure of 0.04 kPa, for 22.5 minutes and at a temperature of 610° C. Then, a resist mask was clad on the surface of the poly-Si film.

Subsequently, those parts of the poly-Si film that are not clad with the resist mask were completely dislodged by dry etching with the use of CF-based gases (mixed gases of $CF_4$, $O_2$, HBr and $Cl_2$). In other words, the dry etching was conducted in such a manner that the resist mask-clad parts of the poly-Si film are left intact while other parts of the poly-Si film are dislodged. The thickness of the oxide film (in those parts not clad with the resist mask) was 15 nm when measured at the end of the dry etching. The thermally oxidized film and the TEOS film have survived the etching process.

Then, the resist mask was removed by $O_2$ gas ashing to acquire a semiconductor substrate which is to be used in the following treatment (treatment with a treating fluid). Unnecessary substances such as modified substances of the resist mask, residues and the like were present on the surface of the semiconductor substrate (silicon substrate with a thermally oxidized film, a CVD oxide film and a poly-Si film) that has been subject to the ashing.

[Treatment by Treating Fluid]

The semiconductor substrate thus acquired was treated with a treating fluid containing a predetermined ratio of HF

TABLE 1

| T/F No. | F/R of $1^{st}$ liquid [ml/min] | F/R of $2^{nd}$ liquid [ml/min] | F/R of DI water [ml/min] | X [mol/L] | Y [mol/L] | X/Y | Damage incurred | Unnecessary substances removed |
|---|---|---|---|---|---|---|---|---|
| 1 | 0 | 20 | 4,000 | 0 | 0.14 | 0 | Yes | O |
| 2 | 15 | 20 | 4,000 | 0.027 | 0.14 | 0.20 | Yes | O |
| 3 | 20 | 20 | 4,000 | 0.037 | 0.14 | 0.26 | Yes | O |
| 4 | 25 | 20 | 4,000 | 0.046 | 0.14 | 0.33 | No | O |
| 5 | 30 | 20 | 4,000 | 0.055 | 0.14 | 0.39 | No | O |
| 6 | 35 | 20 | 4,000 | 0.065 | 0.14 | 0.45 | No | O |
| 7 | 40 | 20 | 4,000 | 0.074 | 0.14 | 0.52 | No | O |
| 8 | 45 | 20 | 4,000 | 0.083 | 0.14 | 0.58 | No | O |
| 9 | 50 | 20 | 4,000 | 0.092 | 0.14 | 0.65 | No | O |
| 10 | 55 | 20 | 4,000 | 0.101 | 0.14 | 0.72 | No | O |
| 11 | 60 | 20 | 4,000 | 0.110 | 0.14 | 0.78 | No | O |
| 12 | 65 | 20 | 4,000 | 0.119 | 0.14 | 0.85 | No | X |
| 13 | 70 | 20 | 4,000 | 0.128 | 0.14 | 0.91 | No | X |

T/F: Treating Fluid,
F/R: Flow Rate and
DI: Deionized and NH$_4$OH. The treatment with the treating fluid was conducted in the following manner.

At an initial step, the semiconductor substrate acquired in the above process was fixedly secured to a treatment stage of a single wafer spin cleaning apparatus and caused to rotate together with the stage, during which time a treating fluid composed of the mixture of a first liquid containing NH$_4$OH and a second liquid containing HF was applied to the semiconductor substrate from a nozzle. In this process, appearances of the thermally oxidized film, the poly-Si film and the CVD oxide film were observed. The treating fluid was prepared in such a manner that the first liquid and the second liquid are admixed with each other in a mixing part midway of a pipe arrangement. The first liquid used was ammonia water (the mixture of ammonia and deionized water) whose NH$_4$OH concentration is equal to 7.45 [mol/L] and the second liquid used was hydrofluoric acid (the mixture of hydrogen fluoride and deionized water) whose HF concentration is equal to 28.65 [mol/L].

The semiconductor substrate thus produced was subject to the same treatment with a treating fluid as described above while changing the flow rates of the first liquid and the second liquid, at which time appearances of the thermally oxidized film, the poly-Si film and the CVD oxide film were observed.

As a consequence, it was possible to rapidly remove the CVD oxide film without adversely affecting the thermally oxidized film, the poly-Si film and the like in case of using a treating fluid that satisfies the relationships $0.30 \leq X/Y \leq 0.78$ and $0.03 \leq Y \leq 6.0$. Particularly, in the event of employing a treating fluid that satisfies the relationship $0.30 \leq X/Y \leq 0.43$, the CVD oxide film could be certainly removed within a shortened period of time without adversely affecting the thermally oxidized film, the poly-Si film and the like. On the contrary, in case of using a treating fluid that fails to satisfy the relationship $0.30 \leq X/Y \leq 0.78$, viz., in case of employing a treating fluid that meets the relationship $X/Y < 0.30$ or $X/Y > 0.78$, a number of problems were given rise to in that the thermally oxidized film, a need-to-survive part, is unintentionally removed together with the CVD oxide film, a need-to-remove part, damage is caused to the poly-Si film, a need-to-survive part, and the CVD oxide film, a need-to-remove part, is not sufficiently removed.

Figure 6:
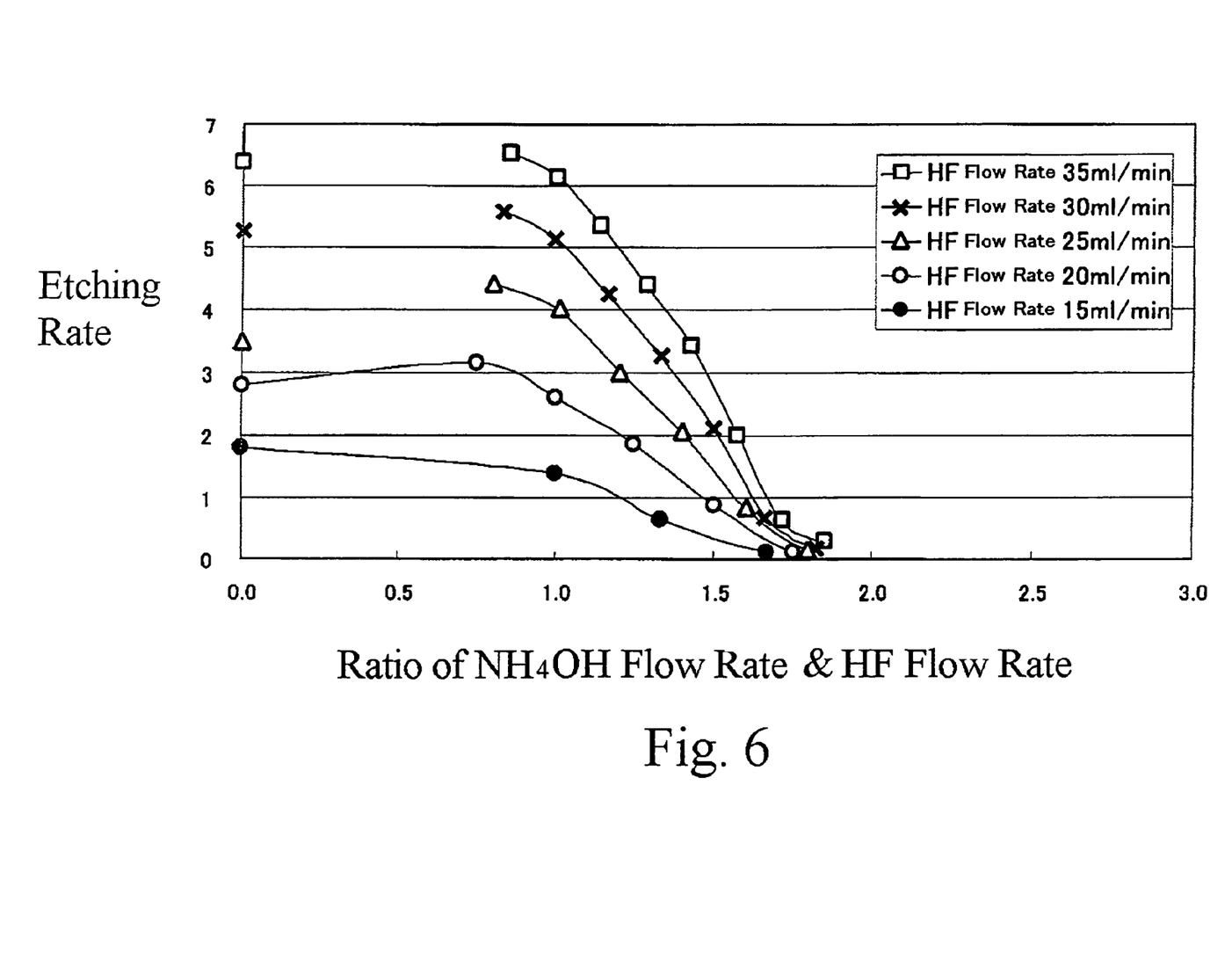
FIG. 6 is a graphical representation illustrating the etching rate of a thermally oxidized film (need-to-survive part) at the time of changing the flow rates of a first liquid and a second liquid.

Shown in FIG. 6 is the etching rate of the thermally oxidized film (a need-to-survive part) at the time when the flow rates of the first liquid and the second liquid were respectively changed in the manner as noted above.

It can be seen in FIG. 6 that use of a treating fluid satisfying the relationship $0.30 \leq X/Y \leq 0.78$ helps sufficiently reduce the etching rate of the thermally oxidized film.

Example 3

A semiconductor component having the polymetal gate electrodes as shown in FIG. 2 was produced by the method described above in connection with the preferred embodiment.

At this time, NH$_4$OH concentration X [mol/L] and HF concentration Y [mol/L] in the treating fluid were changed as in the preceding Examples.

The result was the same as in the preceding Examples. Specifically, in case of using a treating fluid that satisfies the relationships $0.30 \leq X/Y \leq 0.78$ and $0.03 \leq Y \leq 6.0$, it was possible to remove, with increased certainty, such unnecessary substances as resist residues, particles, polymers (dry etched polymers) and the like without adversely affecting the need-to-survive parts (e.g., tungsten nitride film 632 and tungsten film 633 of which the polymetal gate electrodes 63 are composed). On the contrary, in case of using a treating fluid that fails to satisfy the relationship $0.30 \leq X/Y \leq 0.78$, viz., in case of employing a treating fluid that meets the relationship $X/Y < 0.30$ or $X/Y > 0.78$, problems were posed in that the need-to-survive parts are unintentionally removed together with the unnecessary substances and the unnecessary substances (the need-to-remove parts) are not sufficiently removed.

Example 4

A complementary metal oxide semiconductor (CMOS) was produced by the method as shown in FIGS. 3 and 4 and as described above in respect of the preferred embodiment.

At this time, NH$_4$OH concentration X [mol/L] and HF concentration Y [mol/L] in the treating fluid were changed as in the preceding Examples.

The result was the same as in the preceding Examples. Specifically, in case of using a treating fluid that satisfies the relationships $0.30 \leq X/Y \leq 0.78$ and $0.03 \leq Y \leq 6.0$, it was possible to remove, with increased certainty, such unnecessary substances as resist residues, particles, polymers (dry etched polymers) and the like without adversely affecting the need-to-survive parts (e.g., those parts composed of high melting point metal). On the contrary, in case of using a treating fluid that fails to satisfy the relationship $0.30 \leq X/Y \leq 0.78$, viz., in case of employing a treating fluid that meets the relationship $X/Y < 0.30$ or $X/Y > 0.78$, problems were posed in that the need-to-survive parts are unintentionally removed together with the unnecessary substances and the unnecessary substances (the need-to-remove parts) are not sufficiently removed.

Example 5

As in the preceding Examples, a liquid crystal panel was produced by using a treating fluid that satisfies the relationships $0.30 \leq X/Y \leq 0.78$ and $0.03 \leq Y \leq 6.0$. Also produced is a projection display apparatus that incorporates the liquid crystal panel. The projection display apparatus thus produced was capable of displaying clear and high contrast images for an extremely long period of time. This means that electronic appliances incorporating the semiconductor component of the present invention exhibit enhanced reliability.

Although preferred embodiments of the present invention have been set forth in the foregoing, it will be apparent to those skilled in the art that various changes or modifications may be made thereto within the scope of the invention defined by the appended claims.

What is claimed is:

1. A semiconductor substrate treating method, comprising the step of treating a semiconductor substrate with a treating fluid consisting essentially of deionized water, NH$_4$OH and HF wherein the relationships $0.30 \leq X/Y \leq 0.78$ and $0.03 \leq Y \leq 6.0$ are satisfied, where X represents a concentration [mol/L] of NH$_4$OH in the treating fluid and Y represents a concentration [mol/L] of HF in the treating fluid, and wherein the treating fluid is used to remove an oxide film formed by a gas phase method and subsisting on the semiconductor substrate and remove an etching reaction product or a modified substance of the reaction product subsisting on the semiconductor substrate.

2. The method as recited in claim 1, wherein the relationships $0.30 \leq X/Y \leq 0.43$ and $0.03 \leq Y \leq 6.0$ are satisfied, where X represents a concentration [mol/L] of NH$_4$OH in the treating fluid and Y represents a concentration [mol/L] of HF in the treating fluid.

3. The method as recited in claim 1, wherein the relationships $0.43 \leq X/Y \leq 0.78$ and $0.03 \leq Y \leq 6.0$ are satisfied, where X represents a concentration [mol/L] of NH$_4$OH in the treating fluid and Y represents a concentration [mol/L] of HF in the treating fluid.

4. The method as recited in claim 1, wherein the treating fluid is prepared by admixing at least a first liquid containing NH$_4$OH and a second liquid containing HF within an apparatus for treating the semiconductor substrate.

5. The method as recited in claim 1, wherein the treating fluid is prepared by admixing at least a first liquid containing NH$_4$OH, a second liquid containing HF and the deionized water within an apparatus for treating the semiconductor substrate.

6. The method as recited in claim 1, wherein the treating fluid is substantially free from H$_2$O$_2$.

7. The method as recited in claim 1, wherein a pH of the treating fluid is higher than a pH of HF.

8. The method as recited in claim 1, wherein the etching reaction product or the modified substance of the reaction product is a residue created by CF-based gas dry etching, a fluorocarbon-based substance, an oxide of the fluorocarbon-based substance and a compound having a partial structure of Si—C—F—O.

9. A semiconductor substrate treating method, comprising:
preparing a semiconductor substrate; preparing a treating fluid by admixing a first liquid containing NH4OH and a second liquid containing HF, and water within an apparatus for treating the semiconductor substrate; and
treating the semiconductor substrate with the treating fluid consisting essentially of deionized water, NH4OH and HF wherein the relationships $0.30 \leq Y \leq 78$ and $0.03 \leq Y \leq 6.0$ are satisfied so that a pH of the treating fluid is higher than a pH of HF, where X represents a concentration [mol/L] of NH4OH in the treating fluid and Y represents a concentration [mol/L] of HF in the treating fluid, wherein the producing the semiconductor substrate comprises:

preparing a substrate;

forming a thermal oxide film on the substrate;

forming an oxide film on the thermal oxide film by a gas phase method;

forming a Si3N4 film or a poly-Si film on the oxide film, the Si3N4 film and the poly-Si film each having a surface;

providing a resist mask on a part of the surface of the Si3N4 film or the poly-Si film;

etching the Si3N4 film or the poly-Si film on which no resist mask is provided, thereby generating an etching reaction product or a modified substance of the etching reaction product on the oxide film; and removing the resist mask to obtain the semiconductor substrate; and wherein the treating fluid is used to remove the oxide film and remove the etching I reaction product or the modified substance of the reaction product.

10. The method as recited in claim 9, wherein the treating liquid is heated or cooled.

* * * * *